Feb. 17, 1959 R. E. TURNAGE, JR 2,874,311

LINEAR SWEEP-SIGNAL GENERATOR

Filed Jan. 26, 1954 2 Sheets-Sheet 1

Feb. 17, 1959 R. E. TURNAGE, JR 2,874,311

LINEAR SWEEP-SIGNAL GENERATOR

Filed Jan. 26, 1954 2 Sheets-Sheet 2

United States Patent Office 2,874,311

Patented Feb. 17, 1959

2,874,311

LINEAR SWEEP-SIGNAL GENERATOR

Rodger E. Turnage, Jr., Babylon, N. Y., assignor to Hazeltine Research, Inc., Chicago, Ill., a corporation of Illinois Application January 26, 1954, Serial No. 406,131

15 Claims. (Cl. 307—88.5)

*General*

This invention relates to linear sweep-signal generators and, while the generator of the present invention is of general application and may utilize vacuum-tube circuits, it is particularly suited to circuits of the transistor type and will be described accordingly.

One type of sweep-signal generator heretofore proposed includes a time-constant circuit having an exponential signal-developing characteristic for developing the sweep signal and thus an approximately linear sweep signal may be obtained by utilizing only a limited portion of the exponential characteristic. This signal is not sufficiently linear, however, for applications requiring a sweep signal having a high degree of linearity.

Other sweep-signal generators heretofore proposed include circuits, such as so-called "bootstrap" circuits, for controlling the rate of signal development in a time-constant circuit having an exponential signal-developing characteristic, thereby to generate a substantially linear sweep signal. Such circuits, however, may be more complex than is desirable or necessary for some applications.

A sweep-signal generator of the transistor type previously proposed comprises a single-transistor monostable switching circuit having a resistor of relatively large value connected to the base of the transistor and a time-constant network coupled to the emitter for effecting a monostable switching operation. The general operation of a circuit of this type is analogous to a vacuum-tube circuit of the so-called "one-shot" multivibrator type. During an operating cycle, such a circuit generates a sweep signal at the emitter. This sweep signal, however, is not sufficiently linear for many applications.

It is an object of the invention, therefore, to provide a new and improved linear sweep-signal generator which avoids one or more of the foregoing disadvantages and limitations of such generators heretofore proposed.

It is another object of the invention to provide a new and improved sweep-signal generator of simple and inexpensive construction for generating a substantially linear sweep signal.

It is a further object of the invention to provide a new and improved sweep-signal generator of the transistor type for developing a substantially linear sweep signal.

In accordance with the invention, a transistor circuit for generating linear sweep signals comprises a transistor having emitter, base, and collector electrodes and means for altering the conductivity condition of the transistor. The transistor circuit also includes first circuit means coupled to one of the electrodes and responsive to the conductivity alteration for developing a first sweep signal having a nonlinear component of predetermined polarity. The transistor circuit finally includes time-constant circuit means having one terminal thereof coupled to another of the electrodes and to the first circuit means and responsive to the conductivity alteration for developing a second nonlinear component similar to but of polarity opposite to the first nonlinear component which combines with the first sweep signal to develop a resultant substantially linear sweep signal.

For a better understanding of the present invention, together with other and further objects thereof, reference is had to the following description taken in connection with the accompanying drawings, and its scope will be pointed out in the appended claims.

Referring to the drawings.

Figure 1:
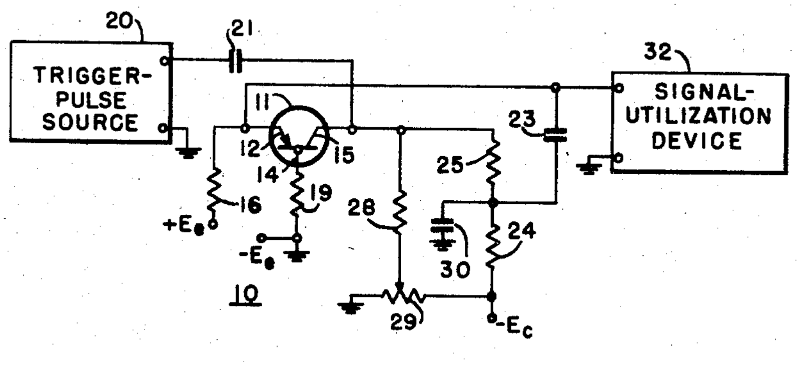
Fig. 1 is a circuit diagram, partly schematic, of a linear sweep-signal generator of the transistor type constructed in accordance with the present invention.

*Description of sweep-signal generator of Fig. 1*

Referring now to Fig. 1 of the drawings, there is represented a transistor circuit for generating linear sweep signals comprising circuit means 10 having a first output circuit for generating a first sweep signal having a nonlinear component of predetermined polarity and a second output circuit for generating a control signal. The circuit means 10 may include, for example, a transistor 11 having an emitter 12, a base 14, and a collector 15 and having variable-conductivity operating characteristics.

The circuit means 10 also includes bias-circuit means coupled to the transistor 11 for maintaining the transistor in a first condition of conductivity. The bias-circuit means includes, for example, a source of bias voltage $+E_e$, $-E_e$ coupled to the emitter 12 through a resistor 16 and coupled to the base 14 through a base resistor 19 for maintaining the transistor 11 in a condition of high conductivity.

The circuit means 10 also comprises control-circuit means including the bias-circuit means for altering the conductivity condition of the transistor 11. The control-circuit means may also include, for example, a repetitive trigger pulse-supply circuit comprising a coupling condenser 21 connected between a trigger pulse source 20 and the collector 15 for applying positive trigger pulses thereto repetitively to decrease the conductivity of the transistor 11.

The previously mentioned first output circuit of the circuit means 10 is coupled to the transistor 11 for responding to the altered conductivity of the transistor 11 to generate a first sweep signal having a nonlinear component of predetermined polarity and is coupled to the emitter-base bias-circuit means for maintaining the transistor in a condition of altered conductivity over a predetermined magnitude range of the sweep signal and for restoring the transistor 11 to the first condition of conductivity at the end of the range to terminate the sweep signal. The first output circuit includes a first resistor-condenser time-constant network comprising the resistor 16 and condenser 23 coupled across voltage sources $+E_e$, $-E_c$ through second time-constant circuit means, more fully described subsequently. The junction between resistor 16 and condenser 23 is coupled to the emitter 12 to render the network responsive to the altered conductivity of the transistor 11 for generating a first repetitive exponential sweep signal having a nonlinear component of positive polarity.

The second output circuit of the circuit means 10 is coupled to the transistor 11 and is responsive to the altered conductivity for developing during the sweep interval a repetitive collector signal of approximately rectangular wave form and negative polarity. The second output circuit may include, for example, the emitter source $+E_e$, the resistor 16, the transistor 11, and a load resistor 25 coupled to the collector 15 and to the voltage sources $+E_e$, $-E_c$ through the second time-constant circuit means which is common to the first and second output circuits for deriving from the collector signal a second exponential sweep signal having a nonlinear component similar to but of polarity opposite to the first sweep-signal component, whereby there is developed across the first output circuit a resultant substantially linear sweep signal.

The second time-constant circuit means may comprise, for example, resistor 24 and a condenser 30 connected in parallel with the resistor 24 and the source $-E_c$ for deriving from the collector signal a second repetitive exponential sweep-signal having a nonlinear component of negative polarity and amplitude approximately equal to that of the first sweep-signal component. The value of the resistor 24 preferably is of a smaller order of magnitude than that of the resistor 16 so that the resistor 24 and condenser 30 have negligible effect on the charge time of the condenser 23. The time constant of resistor-condenser network 24, 30 preferably is of a smaller order of magnitude than that of the network 16, 23 for the same reason. The relative values of the resistors 24 and 25 and the condenser 30 preferably are so selected that the nonlinear component of the exponential sweep signal developed across the condenser 30 has an amplitude approximately equal to that of the nonlinear component of the first exponential sweep signal.

A resistor 28 is coupled to the collector 15 and to the source of voltage $-E_c$ through a voltage divider 29 which may be adjusted to compensate for undesired transistor parameter variations occurring, for example, when a replacement transistor is substituted. There is coupled to the sweep-signal generator a signal-utilization device 32 which may be, for example, a sweep-signal amplifier stage and deflection circuit of a cathode-ray tube oscilloscope.

*Operation of sweep-signal generator of Fig. 1*

Figure 2:
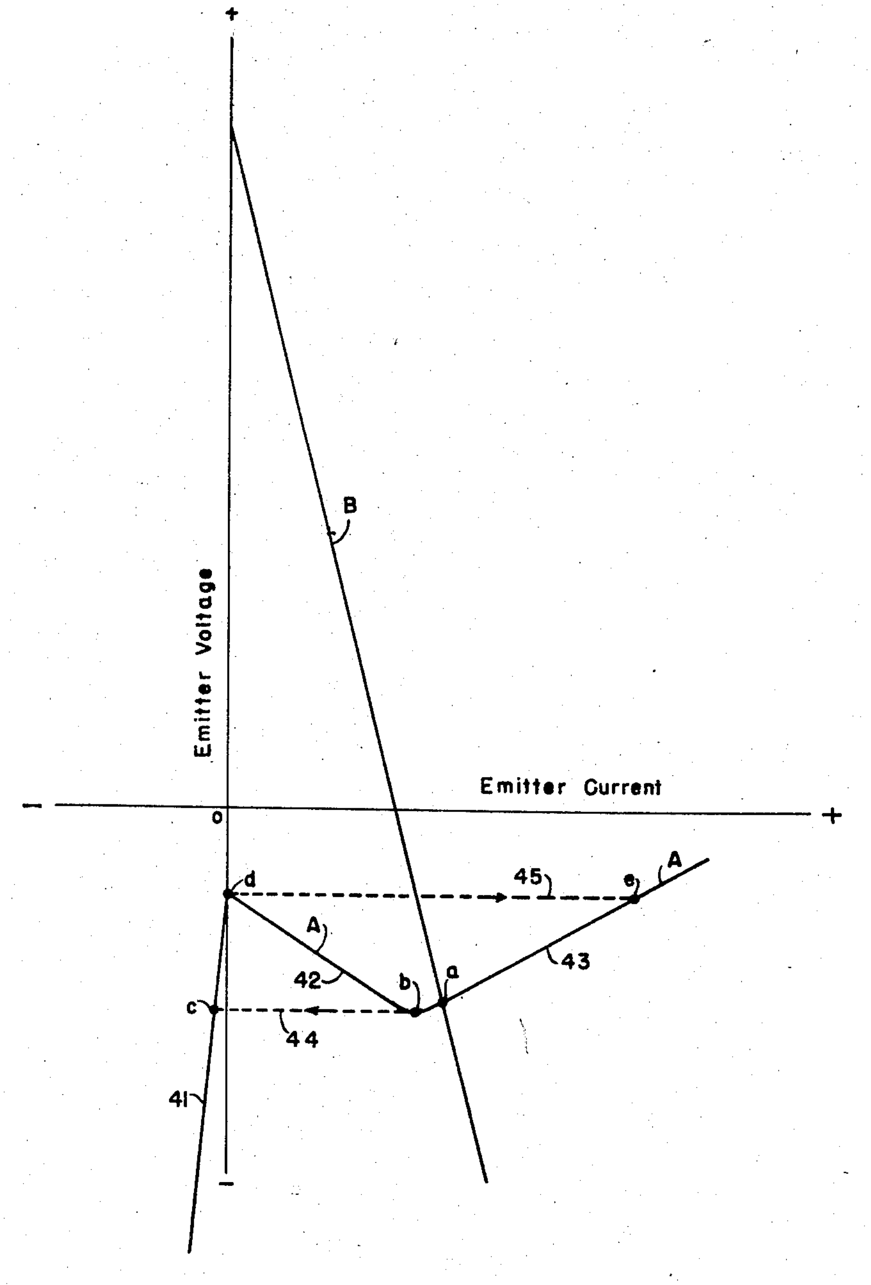
Fig. 2 is a graph of the emitter current-voltage characteristics of the generator of Fig. 1.

Considering the operation of the sweep-signal generator just described, Fig. 2 is a graph representing the emitter current-voltage characteristic of the transistor generator 10.

In accordance with principles well known in the art, the generator 10 preferably operates as a monostable switching circuit of the type having a static emitter current-voltage characteristic, represented by curve A of Fig. 2, and extending over distinct ranges of generator emitter circuit conductivity, the emitter voltage being with respect to a zero voltage level. The first range represented by section 41 of curve A is one of low positive conductivity, the second range represented by section 42 of curve A is one of high negative conductivity, while the third range represented by section 43 of curve A is one of relatively high positive conductivity. The transistor 11 operates in conditions of low, intermediate, and high emitter-collector conductivity corresponding to generator operation in the three respective ranges of generator conductivity. The bias voltage $+E_e$ and the resistor 16 impart to the generator 10 an emitter load characteristic represented by curve B of Fig. 2 which may, for example, intersect the emitter current-voltage characteristic represented by curve A at point *a*. This intersection represents a quiescent operating point in the range of relatively high generator conductivity.

Figure 3:
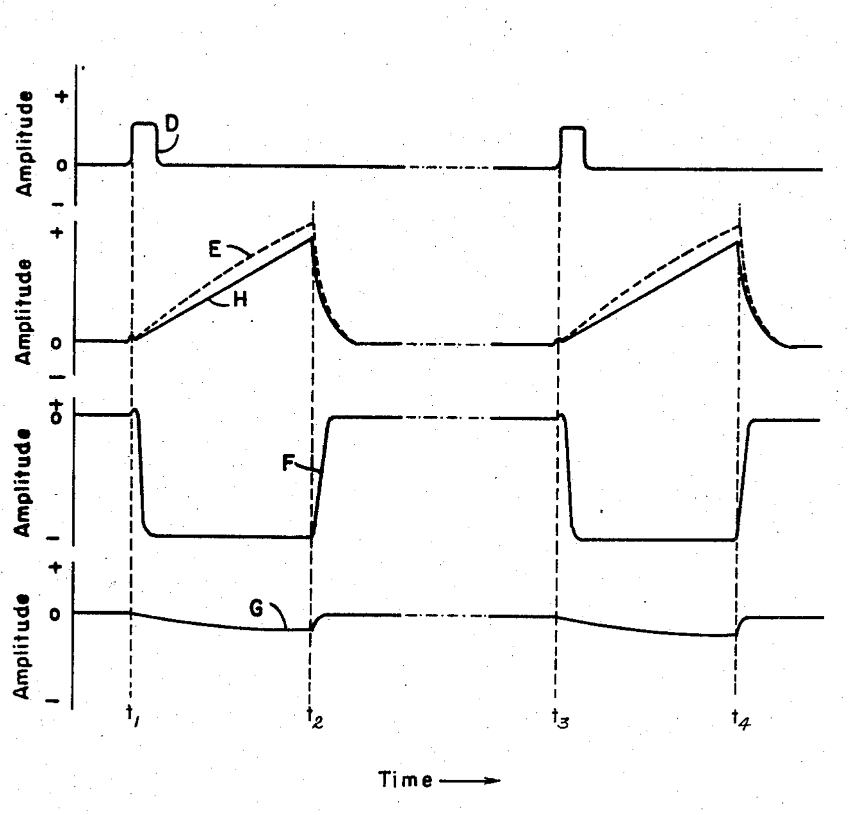
Fig. 3 is a graph representing signals developed at various points of the Fig. 1 generator and used in explaining the operation thereof.

The trigger-pulse source 20 supplies to the collector 15 repetitive trigger pulses represented by curve D of Fig. 3 for repetitively altering the conductivity of the transistor 11. These trigger pulses may have, for example, a duration of approximately 1 microsecond and a repetition rate of 1000 pulses per second. At a time $t_1$, one of these pulses is supplied to the collector 15 while the transistor 11 is operating in a condition of high emitter-collector and collector-base conductivity. A considerable portion of the trigger pulse is, therefore, developed across the base resistor 19. This raises the voltage level at the base 14, thereby decreasing the emitter-to-base voltage difference and, consequently, the emitter current flow.

The decrease in emitter current flow caused by the trigger pulse is, because of amplification within the transistor 11 itself, effective to cause an amplified decrease in the collector current which, in turn, decreases the voltage drop across the base resistor 19 due to the flow of collector current. This decrease in voltage drop causes the voltage level at the base 14 to rise rapidly, which further reduces the emitter current flow. This regenerative process is cumulative so that the operating condition of the transistor 11 almost instantaneously shifts to a condition of low conductivity. This change is represented in Fig. 2 by a shift of the operating point from point *b* to point *c*, along line 44. As represented in Fig. 2, the emitter voltage remains substantially constant during this change because the voltage across the condenser 23 cannot change instantaneously.

Since very little reverse emitter current then flows, the voltage level at the emitter 12 rises at a rate determined in accordance with the time constant of the resistor 16 and the condenser 23 which charges as the voltage level rises. As the condenser 23 charges, the operating point represented on the Fig. 2 graph moves along section 41 of curve A from point *c* to point *d*. As the operating point changes while the condenser 23 charges, there is developed across the condenser 23 a sweep signal represented by broken-line curve E of Fig. 3 during the time interval $t_1$—$t_2$ and having a nonlinear component of positive polarity and which may, for example, be of an exponential nature. By "positive polarity" is meant that the nonlinear component is of such polarity as to cause the developed sweep signal to depart from a linear signal in a positive voltage direction. The percent of nonlinearity of curve E, that is, ratio of the maximum departure of curve E from a linear signal to the magnitude of the linear signal, may be of the order of 15%. The duration of the time interval required for the operating point to reach the knee of curve A at point *d* is determined by the first time-constant network comprising resistor 16 and condenser 23 and the difference in voltages of the condenser 23 and source $+E_e$. This interval may be, for example, 20 microseconds in duration.

When the emitter voltage has increased so that the operating point is at point *d*, a further increase of voltage causes positive emitter current again to flow which, in turn, causes an amplified increase in collector-current flow. The base voltage level then becomes more negative, thereby increasing the emitter-to-base bias which, in turn, further increases the emitter current flow. This regenerative process continues until the transistor 11 is again in a condition of high conductivity. This increase in conductivity is represented by a shift in the operating point on the Fig. 2 graph from point *d* to point *e* along broken line 45. This shift occurs almost instantaneously and takes place at a constant voltage level because the voltage across the condenser 23 cannot change instantaneously.

With the transistor 11 now operating in a condition of high conductivity, the charge acquired by the condenser 23 during the low-conductivity operating interval discharges through the transistor 11 and the load resistor 25, thus causing the operating point represented on curve A of Fig. 2 to move from point *e* to its original quiescent point *a*. Because of the low impedance of this discharge path, this change in emitter voltage level occurs fairly rapidly and corresponds to the trailing edge of the sweep signal, represented by curve E of Fig. 3 occurring after time $t_2$. Subsequent to time $t_2$, the transistor remains in a condition of high conductivity and the operating point may be represented as remaining at the quiescent point *a* of curve A until the occurrence of the next trigger pulse at time $t_3$, which initiates another cycle of operation similar to that just described.

During the operating cycle just described, the conductivity of the transistor 11 switches from a high-conductivity condition to a low-conductivity condition and then returns to the high-conductivity condition. Consequently, the collector 15 current undergoes a variation of approximately rectangular wave form and thereby develops a collector voltage of approximately rectangular wave form and negative polarity, as represented by curve F of Fig. 3, across the network comprising resistor 24, load resistor 25, and condenser 30. In response to the collector current flow, there is developed across the resistor 24 an exponential sweep-voltage signal having a nonlinear component of negative polarity, as represented by curve G of Fig. 3. The nonlinear sweep-voltage component of negative polarity preferably has an amplitude approximately equal to that of the positive nonlinear component of the emitter sweep voltage. Because the network comprising resistor 24 and condenser 30 is coupled in series relation with the condenser 23 in the first output circuit of the generator, this negative sweep voltage represented by curve G is effectively added to the sweep voltage represented by the dotted curve E of Fig. 3 to give a resultant output sweep voltage represented by curve H of Fig. 3, which is of substantially linear wave form. This linear output sweep voltage may then be applied to an appropriate signal-utilization device 32.

The effective bias voltage of the collector 15 may be adjusted to compensate for undesired changes in operating conditions caused by variations of the parameters of the transistor 11 by adjustment of the voltage divider 29. The parameter variations may be caused, for example, by aging of the transistor or by substitution of a replacement transistor.

It will be understood that the sweep-signal generator 10 need not be externally triggered, but may be free running or astable in operation. Astable operation may be obtained, for example, by suitably selecting the values of the emitter supply voltage source $+E_e$ and resistor 16 so that the emitter load line represented by curve B of Fig. 2 intersects the characteristic curve A at some point along the section 42 of curve A. Operation of the generator 10 under such conditions is analogous to the triggered monostable operation described above except that the generator does not have a stable or quiescent operating point and thus runs free.

While applicant does not intend to limit the invention to any particular design constants, the following values have been found suitable for the transistor sweep-signal generator of Fig. 1:

| | |
|---|---|
| Condenser **21** | 1500 micromicrofarads. |
| Condenser **23** | 4600 micromicrofarads. |
| Condenser **30** | 2200 micromicrofarads. |
| Resistor **16** | 33,000 ohms. |
| Resistor **19** | 10,000 ohms. |
| Resistor **24** | 680 ohms. |
| Resistor **25** | 1200 ohms. |
| Resistor **28** | 6800 ohms. |
| Resistor **29** | 10,000 ohms. |
| Transistor **11** | Western Electric Type A1698. |
| Source $+E_e$ | +100 volts. |
| Source $-E_c$ | −50 volts. |

From the foregoing description of the invention, it will be apparent that the linear sweep-signal generator constructed in accordance with the present invention has the advantages that it is of simple construction and may employ a transistor as an active element.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A transistor circuit for generating linear sweep signals, the circuit comprising: a transistor having emitter, base, and collector electrodes; means for altering the conductivity condition of said transistor; first circuit means coupled to one of said electrodes and responsive to the conductivity alteration for developing a first sweep signal having a nonlinear component of predetermined polarity; and time-constant circuit means having one terminal thereof coupled to another of said electrodes and to said first circuit means and responsive to said conductivity alteration for developing a second nonlinear component, similar to but of polarity opposite to said first nonlinear component, which combines with the first sweep signal to develop a resultant substantially linear sweep signal.

2. A transistor circuit for generating linear sweep signals, the circuit comprising: a transistor having emitter, base, and collector electrodes; means for altering the conductivity condition of said transistor; first circuit means coupled to said emitter electrode and responsive to the conductivity alteration for developing a first sweep signal having a nonlinear component of predetermined polarity; and time-constant circuit means having one terminal thereof coupled to said collector electrode and to said first circuit means and responsive to said conductivity alteration for developing a second nonlinear component, similar to but of polarity opposite to said first nonlinear component, which combines with the first sweep signal to develop a resultant substantially linear sweep signal.

3. A transistor circuit for generating linear sweep signals, the circuit comprising: a transistor having emitter, base, and collector electrodes; means for altering the conductivity condition of said transistor; a resistor-condenser charging network coupled to one of said electrodes and responsive to the conductivity alteration for developing a first sweep signal having a nonlinear component of predetermined polarity; and time-constant circuit means having one terminal thereof coupled to another of said electrodes and to said first circuit means and responsive to said conductivity alteration for developing a second nonlinear component, similar to but of polarity opposite to said first nonlinear component, which combines with the first sweep signal to develop a resultant substantially linear sweep signal.

4. A transistor circuit for generating linear sweep signals, the circuit comprising: a transistor having emitter, base, and collector electrodes; means for altering the conductivity condition of said transistor; first circuit means coupled to one of said electrodes and responsive to the conductivity alteration for developing a first sweep signal having a nonlinear component of predetermined polarity; and integrating circuit means having one terminal thereof coupled to another of said electrodes and to said first circuit means and responsive to said conductivity alteration for developing a second nonlinear component, similar to but of polarity opposite to said first nonlinear component, which combines with the first sweep signal to develop a resultant substantially linear sweep signal.

5. A transistor circuit for generating linear sweep signals, the circuit comprising: a transistor having emitter, base, and collector electrodes; means for altering the conductivity condition of said transistor; a first resistor-condenser time-constant network coupled to one of said electrodes and responsive to the conductivity alteration for developing a first sweep signal having a nonlinear component of predetermined polarity; and a second resistor-condenser time-constant network having a time constant of a smaller order of magnitude than that of said first time-constant network and comprising a resistor having a value of a smaller order of magnitude than the resistor of said first network, the second time-constant network having one terminal thereof coupled to another of said electrodes and to said first network and responsive to said conductivity alteration for developing a second nonlinear component, similar to but of polarity opposite to said first nonlinear component, which combines with the first sweep signal to develop a resultant substantially linear sweep signal.

6. A transistor circuit for generating linear sweep signals, the circuit comprising: a transistor having emitter, base, and collector electrodes; bias-circuit means coupled to said transistor for causing said transistor to operate in a first condition of conductivity; means for altering the conductivity condition of said transistor; first time-constant circuit means coupled to one of said electrodes and responsive to the conductivity alteration for developing a first sweep signal having a nonlinear component of predetermined polarity and coupled to said bias-circuit means for maintaining said transistor in a condition of altered conductivity over a predetermined magnitude range of said sweep signal and for restoring said transistor to said first condition of conductivity at the end of said range to terminate said sweep signal; and second time-constant circuit means having one terminal thereof coupled to another of said electrodes and to said first time-constant circuit means and responsive to said conductivity alteration for developing a second nonlinear component, similar to but of polarity opposite to said first nonlinear component, which combines with the first sweep signal to develop a resultant substantially linear sweep signal.

7. A transistor circuit for generating linear sweep signals, the circuit comprising: a transistor having emitter, base, and collector electrodes; bias-circuit means coupled to said transistor for causing said transistor to operate in a condition of high conductivity; circuit means for supplying repetitive trigger pulses for repetitively decreasing the conductivity of said transistor; first time-constant circuit means coupled to one of said electrodes and responsive to the conductivity decreases for developing a first repetitive sweep signal having a nonlinear component of predetermined polarity and coupled to said bias-circuit means for maintaining said transistor in a condition of decreased conductivity over a predetermined magnitude range of said sweep signal and for restoring said transistor to said condition of high conductivity at the end of said range to terminate said sweep signal; and second time-constant circuit means having one terminal thereof coupled to another of said electrodes and to said first time-constant circuit means and responsive to said conductivity decreases for developing a second repetitive nonlinear component, similar to but of polarity opposite to said first nonlinear component, which combines with the first sweep signal to develop a resultant substantially linear repetitive sweep signal.

8. A transistor circuit for generating linear sweep signals, the circuit comprising: a transistor having emitter, base, and collector electrodes; means for altering the conductivity condition of said transistor; first circuit means coupled to one of said electrodes and responsive to the conductivity alteration for developing a first sweep signal having a nonlinear component of predetermined polarity; a load impedance coupled to a second of said electrodes and responsive to the conductivity alteration for developing a control signal; and time-constant circuit means having one terminal thereof coupled to said first circuit means and to said load impedance and responsive to said control signal for developing a second nonlinear component, similar to but of polarity opposite to said first nonlinear component, which combines with the first sweep signal to develop a resultant substantially linear sweep signal.

9. A transistor circuit for generating linear sweep signals, the circuit comprising: a transistor having emitter, base, and collector electrodes; means for altering the conductivity condition of said transistor; first circuit means coupled to one of said electrodes and responsive to the conductivity alteration for developing a first exponential sweep signal having a nonlinear component of positive polarity; a load impedance coupled to a second of said electrodes and responsive to the conductivity alteration for developing a control signal of approximately rectangular wave form and negative polarity; and time-constant circuit means having one terminal thereof coupled to said first circuit means and to said load impedance and responsive to said control signal for developing a second exponential nonlinear component, of negative polarity and amplitude approximately equal to that of said first nonlinear component, which combines with the first sweep signal to develop a resultant substantially linear sweep signal.

10. A transistor circuit for generating linear sweep signals, the circuit comprising: a transistor having emitter, base, and collector electrodes; circuit means for supplying an operating potential; a load impedance coupled between the potential-supply means and a first of said electrodes for establishing the conductivity condition of the transistor; circuit means for altering the conductivity condition of said transistor; a first condenser having one terminal coupled to said first electrode and responsive to the conductivity alteration for developing a first sweep signal having a nonlinear component of predetermined polarity; and a voltage-divider network coupled to a second of said transistor electrodes and a second condenser coupled to an intermediate point on the voltage divider and responsive to said conductivity alteration for developing a second nonlinear component, similar to but of polarity opposite to said first nonlinear component, said intermediate point on the voltage divider also being coupled to the other terminal of the first condenser for combining the second nonlinear component with the first sweep signal to develop a resultant substantially linear sweep signal.

11. A transistor circuit for generating linear sweep signals, the circuit comprising: a transistor having emitter, base, and collector electrodes; circuit means for supplying an operating potential; a load impedance coupled between the potential-supply means and the emitter electrode for establishing the conductivity condition of the transistor; circuit means for altering the conductivity condition of said transistor; a first condenser having one terminal coupled to said emitter electrode and responsive to the conductivity alteration for developing a first sweep signal having a nonlinear component of predetermined polarity; and a voltage-divider network coupled to the collector electrode and a second condenser coupled to an intermediate point on the voltage divider and responsive to said conductivity alteration for developing a second nonlinear component, similar to but of polarity opposite to said first nonlinear component, said intermediate point on the voltage divider also being coupled to the other terminal of the first condenser for combining the second nonlinear component with the first sweep signal to develop a resultant substantially linear sweep signal.

12. A transistor circuit for generating linear sweep signals, the circuit comprising: a transistor having emitter, base, and connector electrodes; circuit means for supplying an operating potential; a load impedance coupled between the potential-supply means and the emitter electrode for establishing the conductivity condition of the transistor; circuit means coupled to the collector electrode for supplying repetitive trigger pulses thereto for repetitively altering the conductivity condition of said transistor; a first condenser having one terminal coupled to said emitter electrode and responsive to each conductivity alteration for developing a first sweep signal having a nonlinear component of predetermined polarity; and a voltage-divider network coupled to the collector electrode and a second condenser coupled to an intermediate point on the voltage divider and responsive to each conductivity alteration for developing a second nonlinear component, similar to but of polarity opposite to said first nonlinear component, said intermediate point on the voltage divider also being coupled to the other terminal of the first condenser for combining the second nonlinear component with the first sweep signal to develop a resultant substantially linear sweep signal.

13. A transistor circuit for generating linear sweep signals, the circuit comprising: a transistor having emitter, base, and collector electrodes; circuit means for supplying an operating potential; a load impedance coupled between the potential-supply means and a first of said electrodes for establishing the conductivity condition of the transistor; circuit means for altering the conductivity condition of said transistor; a first condenser having one terminal coupled to said first electrode and responsive to the conductivity alteration for developing a first sweep signal having a nonlinear component of predetermined polarity; and a voltage-divider network coupled to a second of said transistor electrodes and a second condenser having a smaller value of capacitance than the first condenser, coupled to an intermediate point on the voltage divider and responsive to said conductivity alteration for developing a second nonlinear component, similar to but of polarity opposite to said first nonlinear component, said intermediate point on the voltage divider also being coupled to the other terminal of the first condenser for combining the second nonlinear component with the first sweep signal to develop a resultant substantially linear sweep signal.

14. A transistor circuit for generating linear sweep signals, the circuit comprising: a transistor having emitter, base, and collector electrodes; circuit means for supplying an operating potential; a load impedance coupled between the potential-supply means and a first of said electrodes for establishing the conductivity condition of the transistor; circuit means for altering the conductivity condition of said transistor; a first condenser having one terminal coupled to said first electrode and responsive to the conductivity alteration for developing a first sweep signal having a nonlinear component of predetermined polarity; a voltage-divider network coupled to a second of said transistor electrodes and a second condenser coupled to an intermediate point on the voltage divider and responsive to said conductivity alteration for developing a second nonlinear component, similar to but of polarity opposite to said first nonlinear component, said intermediate point on the voltage divider also being coupled to the other terminal of the first condenser for combining the second nonlinear component with the first sweep signal to develop a resultant substantially linear sweep signals; and an output terminal coupled to said first electrode for supplying the linear sweep signal to a utilization device.

15. A transistor circuit for generating linear sweep signals, the circuit comprising: a transistor having emitter, base, and collector electrodes; circuit means for supplying an operating potential; a load impedance coupled between the potential-supply means and the emitter electrode for establishing the conductivity condition of the transistor; circuit means coupled to the collector electrode for supplying repetitive trigger pulses thereto for repetitively altering the conductivity condition of said transistor; a first condenser having one terminal coupled to said emitter electrode and responsive to each conductivity alteration for developing a first sweep signal having a nonlinear component of predetermined polarity; a voltage-divider network coupled to the collector electrode and a second condenser, having a smaller value of capacitance than the first condenser, coupled to an intermediate point on the voltage divider and responsive to each conductivity alteration for developing a second nonlinear component, similar to but of polarity opposite to said first nonlinear component, said intermediate point on the voltage divider also being coupled to the other terminal of the first condenser for combining the second nonlinear component with the first sweep signal to develop a resultant substantially linear sweep signal; and an output terminal coupled to said emitter electrode for supplying the linear sweep signal to a utilization device.

References Cited in the file of this patent

UNITED STATES PATENTS

| | | |
|---|---|---|
| 2,232,076 | Newsam | Feb. 18, 1941 |
| 2,237,425 | Geiger et al. | Apr. 8, 1941 |
| 2,533,001 | Eberhard | Dec. 5, 1950 |
| 2,609,507 | Schlesinger | Sept. 2, 1952 |
| 2,611,872 | Lockhart | Sept. 23, 1952 |
| 2,620,448 | Wallace | Dec. 2, 1952 |
| 2,663,800 | Herzog | Dec. 22, 1953 |
| 2,666,139 | Endres | Jan. 12, 1954 |
| 2,679,594 | Fromm | May 25, 1954 |